(12) United States Patent
Chen

(10) Patent No.: US 9,531,366 B2
(45) Date of Patent: Dec. 27, 2016

(54) COMPARATOR WITH CONTROLLED CURRENT SUPPLY CAPACITY

(71) Applicant: FUJITSU LIMITED, Kawasaki-shi, Kanagawa (JP)

(72) Inventor: Yanfei Chen, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/720,048

(22) Filed: May 22, 2015

(65) Prior Publication Data

US 2015/0349758 A1 Dec. 3, 2015

(30) Foreign Application Priority Data

May 30, 2014 (JP) ................................. 2014-112445

(51) Int. Cl.
*H03K 5/22* (2006.01)
*H03K 5/24* (2006.01)

(52) U.S. Cl.
CPC ............ *H03K 5/2472* (2013.01); *H03K 5/249* (2013.01)

(58) Field of Classification Search
CPC .... H03K 5/2481; H03K 5/249; H03K 5/2418; H04L 25/0272; H03F 3/45183
USPC ........................ 327/65–68, 55, 333, 208, 218
See application file for complete search history.

(56) References Cited

U.S. PATENT DOCUMENTS

| 7,728,628 | B2 * | 6/2010 | Chiang ........................... 326/68 |
| 7,898,292 | B2 * | 3/2011 | Koto ............................... 326/68 |
| 8,659,337 | B2 * | 2/2014 | Elkin et al. .................... 327/208 |
| 8,836,376 | B2 * | 9/2014 | Danjo .............................. 327/65 |
| 2013/0176156 | A1 | 7/2013 | Danjo | |

FOREIGN PATENT DOCUMENTS

| JP | 2001076491 A | * | 3/2001 |
| JP | 2011-151452 | | 8/2011 |
| JP | 2013-143626 | | 7/2013 |

* cited by examiner

*Primary Examiner* — Quan Tra
(74) *Attorney, Agent, or Firm* — Fujitsu Patent Center

(57) ABSTRACT

A comparator includes an input-stage circuit that sets, in a first operating state, two voltage signals in a first voltage state, and changes, in a second operating state, the two voltage signals from the first voltage state to a second voltage state at different speeds, a latch-stage circuit that includes two field effect transistors and two inverters, the two field effect transistors receiving the two voltage signals at control nodes and disposed between two output nodes and a predetermined potential, the two inverters cross-coupled between the two output nodes and placed in an inactive state in the first operating state and in an active state in the second operating state, and a control circuit that controls current capacities in two paths through which drive voltages are applied to the two inverters, causing the current capacities to be different during at least part of a period of the second operating state.

7 Claims, 12 Drawing Sheets

COMPARATOR WITH CONTROLLED CURRENT SUPPLY CAPACITY

CROSS-REFERENCE TO RELATED APPLICATIONS

The present application is based upon and claims the benefit of priority from the prior Japanese Patent Application No. 2014-112445 filed on May 30, 2014, with the Japanese Patent Office, the entire contents of which are incorporated herein by reference.

FIELD

The disclosures herein relate to a comparator, an electronic circuit, and a method of controlling a double-tail comparator.

BACKGROUND

In general, shortening the channel length of transistors serves to increase the operating speed of an electronic circuit such as a comparator. With the use of transistors having a small size, however, individual transistors end up having different characteristics due to manufacturing variation even among the transistors having the same structure and the same size. In the case of a comparator, such differences in transistor characteristics bring about an offset.

An analog-to-digital converter that is required to have high precision may employ the function to cancel an offset. Further, a decision-feedback equalizer used in a receiver circuit may readily perform equalization by use of a comparator having an offset cancellation function. Accordingly, it is preferable for a comparator to have an offset cancellation function.

A double-tail comparator includes an input stage and an output latch stage, and is capable of operating at high speed over a wide range of common voltage and power supply voltage. A double-tail comparator having an offset cancellation function is known in the art (see Patent Document 1, for example). A comparator that employs added adjustment-purpose transistors to cause the input transistors to have imbalance may suffer drop in operating speed due to the parasitic capacitance of the added transistors.

RELATED-ART DOCUMENTS

Patent Document

[Patent Document 1] Japanese Laid-open Patent Publication No. 2013-143626

SUMMARY

According to an aspect of the embodiment, a comparator includes an input-stage circuit configured to set, in a first operating state, two voltage signals in a first voltage state, and to change, in a second operating state, the two voltage signals from the first voltage state to a second voltage state at respective different speeds whose difference is responsive to a difference between voltage levels of two input signals, a latch-stage circuit that includes two field effect transistors and two inverters, the two field effect transistors receiving the two voltage signals at respective control nodes thereof and disposed between two respective output nodes and a node of a predetermined potential, the two inverters being cross-coupled between the two output nodes, and the two inverters being placed in an inactive state in the first operating state and placed in an active state in the second operating state, and a control circuit configured to control current supply capacities in two paths through which drive voltages are applied to the two inverters separately from each other, wherein the control circuit is configured to cause the current supply capacities in the two paths to be different from each other during at least part of a period of the second operating state.

A method of controlling a double-tail comparator which includes an input stage and an output latch stage, the method comprising making current supply capacities in two paths different from each other, the two paths being paths through which drive voltages are applied to two inverters separately from each other, the two inverters being cross-coupled between two output nodes of the output latch stage.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
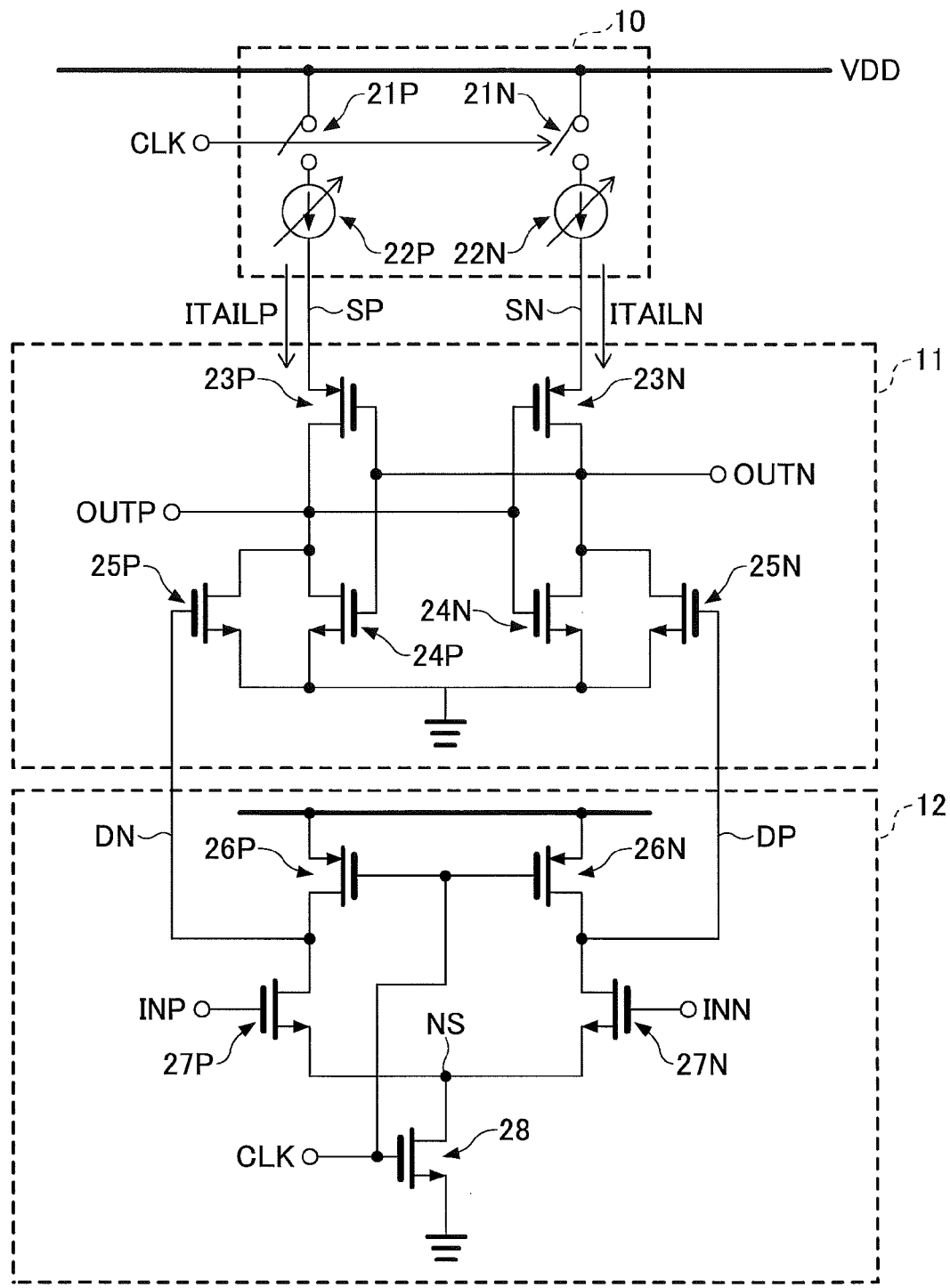
FIG. 1 is a drawing illustrating an example of the configuration of a comparator according to an embodiment.

FIG. 1 is a drawing illustrating an example of the configuration of a comparator according to an embodiment. The comparator illustrated in FIG. 1 includes a control circuit 10, a latch-stage circuit 11, and an input-stage circuit 12. The control circuit 10 includes switch circuits 21P and 21N and constant-current circuits 22P and 22N. The latch-stage circuit 11 includes PMOS transistors 23P and 23N, NMOS transistors 24P and 24N, and NMOS transistors 25P and 25N. The input-stage circuit 12 includes PMOS transistors 26P and 26N, NMOS transistors 27P and 27N, and an NMOS transistor 28.

In the circuit illustrated in FIG. 1, the PMOS transistors and the NMOS transistors may be replaced with NMOS transistors and PMOS transistors, respectively, with the power supply voltage and the ground voltage being swapped over. Such alterations produce a circuit that operates in the same or similar manner as the circuit illustrated in FIG. 1. Accordingly, the polarities of the transistor channels are not limited to those which are illustrated. Further, the transistors are not limited to MOS transistors, and may be any type of field-effect transistors.

In the input-stage circuit 12, two voltage signals DN and DP are placed in a first voltage state (i.e., HIGH in the example illustrated in FIG. 1) in a first operating state (i.e., in the case of a clock signal CLK being LOW). In the input-stage circuit 12, the two voltage signals DN and DP are changed from the first voltage state (HIGH) to a second voltage state (LOW) at respective different speeds responsive to a difference in the voltage levels of two input signals INP and INN in a second operating state (i.e., in the case of the clock signal CLK being HIGH).

To be more specific, at the time of the clock signal CLK being LOW, the PMOS transistors 26P and 26N are conductive, and the NMOS transistor 28 is nonconductive. At this time, the parasitic capacitances present at the two respective drain nodes of the NMOS transistors 27P and 27N are charged, so that the two voltage signals DN and DP are set to HIGH. At the time of the clock signal CLK being HIGH, the PMOS transistors 26P and 26N are nonconductive, and the NMOS transistor 28 is conductive. In the case of the PMOS transistor 26P, for example, as the voltage of the input signal INP rises, the ON resistance of the PMOS transistor 26P decreases. As this happens, the speed at which the parasitic capacitance at the drain node of the NMOS transistor 27P discharges increases, and so does the speed at which the voltage of the voltage signal DN drops. Conversely, as the voltage of the input signal INP drops, the ON resistance of the PMOS transistor 26P increases. As this happens, the speed at which the parasitic capacitance at the drain node of the NMOS transistor 27P discharges decreases, and so does the speed at which the voltage of the voltage signal DN drops. The discharge currents flowing through the NMOS transistors 27P and 27N merge into one at a node NS, and, then, the merged current flows to the ground through the NMOS transistor 28.

At the time of the clock signal CLK being HIGH, the two voltage signals DN and DP change from HIGH to LOW at their respective speeds having a difference responsive to the difference of voltage levels of the two input signals INP and INN. When the voltage level of the input signal INP is higher than the voltage level of the input signal INN, the voltage signal DN changes from HIGH to LOW faster than the voltage signal DP. When the voltage level of the input signal INN is higher than the voltage level of the input signal INP, the voltage signal DP changes from HIGH to LOW faster than the voltage signal DN.

The latch-stage circuit 11 includes the two NMOS transistors 25P and 25N that receive the two voltage signals DN and DP at their respective control nodes, and that are disposed between two respective output nodes OUTP and OUTN and a node having a predetermined potential (i.e., the ground in the example illustrated in FIG. 1). The latch-stage circuit 11 further includes two inverters that are cross-coupled between the two output nodes OUTP and OUTN. The two inverters are placed in an inactive state in the first operating state (i.e., CLK=LOW) and placed in an active state in the second operating state (i.e., CLK=HIGH). The two inverters cross-coupled between the two output nodes include a first inverter formed of a PMOS transistor 23P and an NMOS transistor 24P and a second inverter formed of a PMOS transistor 23N and an NMOS transistor 24N. The output and input of the first inverter are connected to the two output nodes OUTP and OUTN, respectively. The input and output of the second inverter are connected to the two output nodes OUTP and OUTN, respectively. In this manner, the first inverter and the second inverter are cross-coupled such that their inputs are connected to the outputs of each other, thereby forming a latch circuit.

In the second operating state (i.e., CLK=HIGH), drive voltage is applied to the two inverters to place the latch circuit in the active state, and the two voltage signals DN and DP change from HIGH to LOW at the respective speeds that are different from each other in response to the difference of voltage levels of the input signals INP and INN. As the two voltage signals DN and DP change from HIGH to LOW, the NMOS transistors 25P and 25N change from the conductive state to the nonconductive state. When current supply capacities for supplying drive currents ITAILP and ITAILN to the two inverters are equal to each other, a faster voltage rise is observed at one of the output nodes OUTP and OUTN that is on the same side as the drain node of either the NMOS transistor 25P or the NMOS transistor 25N that becomes nonconductive faster than the other. In the manner described above, the voltage difference generated between the output nodes OUTP and OUTN is amplified by the latch circuit. The latch circuit is thus placed in a latched state such that the output node at which a faster voltage rise has occurred is set to HIGH, and the other output node is set to LOW.

In the comparator illustrated in FIG. 1, the current supply capacities for supplying drive currents ITAILP and ITAILN to the two inverters are made different from each other, thereby providing an offset control function as will be described below. Namely, the current supply capacities on the two paths through which respective drive voltages are separately applied to the two inverters are controlled by the control circuit 10, which makes the current supply capacities on these two paths different from each other during at least part of the period of the second operating state (i.e., CLK=HIGH). It may be noted that the two inverters receive drive voltages from the control circuit 10 at nodes SP and SN, respectively.

In the configuration illustrated in FIG. 1, the constant-current circuits 22P and 22N set the current supply capacities for supplying the drive currents ITAILP and ITAILN, respectively, separately from each other. One ends of the switch circuits 21P and 21N are coupled to the power supply voltage VDD, and the other ends thereof are coupled to the constant-current circuits 22P and 22N, respectively. The switch circuits 21P and 21N are placed in the nonconductive state at the time of the clock signal CLK being LOW, and are placed in the conductive state at the time of the clock signal CLK being HIGH. Namely, the control circuit 10 supplies inverter drive currents (i.e., latch drive currents) to the latch-stage circuit 11 during the period of the second operating state (i.e., CLK=HIGH). The constant-current circuits 22P and 22N have the respective current supply capacities thereof set to desired values so as to supply the drive currents ITAILP and ITAILN whose amounts are as much as the amounts responsive to these current supply capacities.

As was previously described, the NMOS transistors 25P and 25N change from the conductive state to the nonconductive state. It is not the case that the control circuit 10 continues to supply constant amounts of currents during such a change. Depending on the states of the NMOS transistors 25P and 25N, the amounts of currents supplied by the control circuit 10 may be set to amounts smaller than the maximum current amounts determined by the current supply capacities of the constant-current circuits 22P and 22N. In the absence of any factor in the latch-stage circuit 11 that inhibits the amounts of currents, the constant-current circuits 22P and 22N supply currents the amounts of which are determined by their respective current supply capacities. When the NMOS transistors 25P and 24P are in a half-conductive state and in a fully nonconductive state, respectively, for example, the amount of current supplied by the constant-current circuit 22P is limited by the amount of current that can flow through the NMOS transistor 25P.

There may be a case in which the two voltage signals DN and DP are at the same potential, and the NMOS transistors 25P and 25N are in the half conductive state of the same level. In such a case, the current supply capacity of the constant-current circuit 22N that is larger than the current supply capacity of the constant-current circuit 22P causes the amount of electric charge flowing into the output node OUTN to be larger than the amount of electric charge flowing into the output node OUTP. As a result, the voltage of the output node OUTN is set higher than the voltage of the output node OUTP. In this manner, the unbalance of current supply capacities serve to make the voltage of the output node OUTN higher than the voltage of the output node OUTP. Namely, the latch circuit is placed in such a state that the output nodes OUTP and OUTN are set to LOW and HIGH, respectively.

In reality, as was previously described, the two voltage signals DN and DP change from HIGH to LOW at respective different speeds in the second operating state (i.e., CLK=HIGH). At one point in time, there may be a situation in which the voltage signal DN is lower voltage than the voltage signal DP, and the NMOS transistor 25P is closer to the fully nonconductive state than the NMOS transistor 25N. In such a case, the amount of electric charge flowing to the ground from the output node OUTP through the NMOS transistor 25P is smaller than the amount of electric charge flowing to the ground from the output node OUTN through the NMOS transistor 25N. Accordingly, provided that the current supply capacities of the constant-current circuits 22P and 22N are the same, the voltage of the output node OUTP becomes higher than the voltage of the output node OUTN.

Alternatively, the current supply capacity of the constant-current circuit 22N may be set larger than the current supply capacity of the constant-current circuit 22P in the control circuit 10. Such a setting causes the amount of electric charge flowing into the output node OUTN to be larger than the amount of electric charge flowing into the output node OUTP. The difference in the amounts of electric charge flowing into the output nodes OUTP and OUTN may be set larger than the difference in the amounts of electric charge flowing to the ground through the NMOS transistors 25P and 25N. With this arrangement, the voltage of the output node OUTN can be set higher than the voltage of the output node OUTP. Namely, the latch circuit is placed in such a state that the output nodes OUTP and OUTN are set to LOW and HIGH, respectively.

As described above, an unbalanced setting of the current supply capacities can create a state in which the voltage of the output node OUTN is higher than the voltage of the output node OUTP even when the voltage of the input signal INP is higher than the voltage of the input signal INN (i.e., the voltage signal DN is lower than the voltage signal DP). Namely, the provision of an offset adjustment mechanism is enabled.

Figure 2:
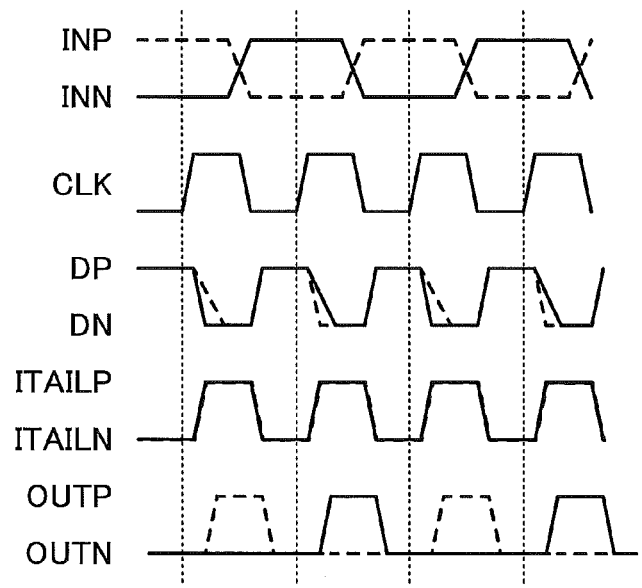
FIG. 2 is a drawing illustrating an example of the operation of the comparator illustrated in FIG. 1 that is observed when an offset adjustment mechanism is inactivated.

FIG. 2 is a drawing illustrating an example of the operation of the comparator illustrated in FIG. 1 that is observed when the offset adjustment mechanism is inactivated. In FIG. 2, a signal waveform illustrated in dashed lines belongs to a signal of a node whose name has "P" at the end thereof or belongs to a signal whose name has "P" at the end thereof. Further, a signal waveform illustrated in solid lines belongs to a signal of a node whose name has "N" at the end thereof or belongs to a signal whose name has "N" at the end thereof. In the example illustrated in FIG. 2, each of the input signals INP and INN is HIGH when the other is LOW, and alternates between HIGH and LOW. The length of the period in which each of the input signals INP and INN maintains a constant voltage level is equal to one cycle of the clock signal CLK.

In the first operating state defined by the clock signal CLK being LOW, the voltage signals DN and DP are both HIGH. In the second operating state defined by the clock signal CLK being HIGH, the voltage signals DN and DP change from HIGH to LOW at respective different speeds whose difference is responsive to a voltage difference between the input signals INP and INN. In response to the clock signal CLK being HIGH, the drive currents ITAILP and ITAILN are supplied. It may be noted that the drive currents ITAILP and ITAILN illustrated in FIG. 2 indicate the respective current supply capacities of the control circuit 10, and are not indicative of the amount of currents that actually flow.

One of the output nodes OUTP and OUTN is set to HIGH on the side where one of the voltage signals DN and DP changes from HIGH to LOW faster than the other. The other one of the output nodes OUTP and OUTN is set to LOW. In the case of the voltage of the input signal INP being higher than the voltage of the input signal INN, the voltage of the output node OUTP is set higher than the voltage of the OUTN, so that the output nodes OUTP and OUTN become HIGH and LOW, respectively. In the case of the voltage of the input signal INP being lower than the voltage of the input signal INN, the voltage of the output node OUTP is set lower than the voltage of the OUTN, so that the output nodes OUTP and OUTN become LOW and HIGH, respectively.

Figure 3:
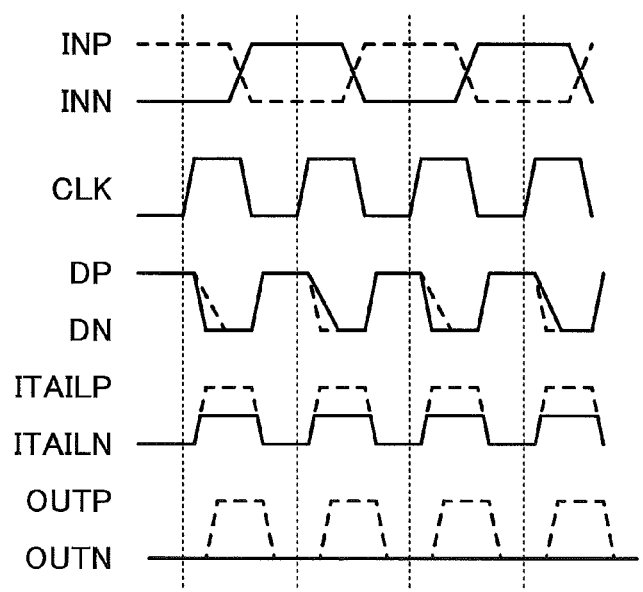
FIG. 3 is a drawing illustrating an example of the operation of the comparator illustrated in FIG. 1 that is observed when the offset adjustment mechanism is activated.

FIG. 3 is a drawing illustrating an example of the operation of the comparator illustrated in FIG. 1 that is observed when the offset adjustment mechanism is activated. Methods of illustration of signal waveforms in FIG. 3 are the same as in FIG. 2. Further, the behaviors of the input signals INP and INN, the clock signal CLK, and the voltage signals DN and DP are the same as or similar to the behaviors of the corresponding signals illustrated in FIG. 2.

In response to the clock signal CLK being HIGH, the drive currents ITAILP and ITAILN are supplied. It may be noted that the drive currents ITAILP and ITAILN illustrated in FIG. 3 indicate the respective current supply capacities of the control circuit 10, and are not indicative of the amount of currents that actually flow. In the example illustrated in FIG. 3, the current supply capacity of the drive current ITAILP is set higher than the current supply capacity of the drive current ITAILN.

One of the output nodes OUTP and OUTN is set to HIGH on the side where one of the voltage signals DN and DP changes from HIGH to LOW faster than the other. The other one of the output nodes OUTP and OUTN is set to LOW. In the case of the voltage of the input signal INP being higher than the voltage of the input signal INN, the voltage of the output node OUTP is set higher than the voltage of the OUTN, so that the output nodes OUTP and OUTN become HIGH and LOW, respectively. Even in the case of the voltage of the input signal INP being lower than the voltage of the input signal INN, the unbalanced setting of the current supply capacities causes the voltage of the output node OUTP to be set higher than the voltage of the OUTN, so that the output nodes OUTP and OUTN become HIGH and LOW, respectively.

Figure 4:
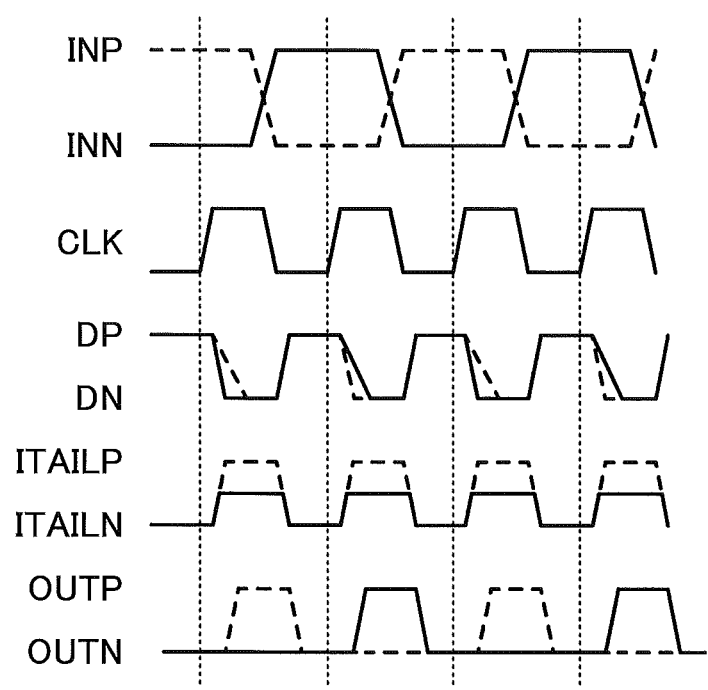
FIG. 4 is a drawing illustrating another example of the operation of the comparator illustrated in FIG. 1 that is observed when the offset adjustment mechanism is activated.

FIG. 4 is a drawing illustrating another example of the operation of the comparator illustrated in FIG. 1 that is observed when the offset adjustment mechanism is activated. Methods of illustration of signal waveforms in FIG. 4 are the same as in FIG. 2. In FIG. 4, the setting of the current supply capacities for the drive currents ITAILP and ITAILN and the setting of the clock signal CLK are the same as or similar to those illustrated in FIG. 3.

In FIG. 4, however, a voltage difference between the input signals INP and INN is larger than in the case of FIG. 3. Because of this, a difference between the speeds at which the respective voltage signals DN and DP change from HIGH to LOW is larger than in the case illustrated in FIG. 3 (but the difference is minute and indiscernible in the illustration). Since the difference between the speeds at which the voltage signals DN and DP change from HIGH to LOW is large, the unbalanced setting of the current supply capacities is not sufficient to overcome such a speed difference. Accordingly, in the case of the voltage of the input signal INP being lower than the voltage of the input signal INN, the voltage of the output node OUTP is set lower than the voltage of the OUTN, so that the output nodes OUTP and OUTN become LOW and HIGH, respectively, as in the case of FIG. 2. In the case of the voltage of the input signal INP being higher than the voltage of the input signal INN, the voltage of the output node OUTP is obviously set higher than the voltage of the OUTN, so that the output nodes OUTP and OUTN become HIGH and LOW, respectively.

As can be seen from comparison between FIG. 3 and FIG. 4, the unbalanced setting of the current supply capacities of the control circuit 10 in the comparator illustrated in FIG. 1 enables the adjustment of threshold values that are employed in the determination of magnitude relationships between the input signals. Namely, the voltage level of the input signal INN that is significantly higher than the voltage level of the input signal INP as illustrated in FIG. 4 results in the output node OUTN being HIGH, which indicates that the input signal INN is higher. On the other hand, the voltage level of the input signal INN that exceeds the voltage level of the input signal INP only by a small margin as illustrated in FIG. 3 results in the output node OUTN being LOW, which leads to the determination that the input signal INN is lower. In this manner, the unbalanced setting of the current supply capacities can produce a signal-level check result that is equivalent to the result obtained by comparing the voltage level of the input signal INP with a voltage value (INN−BIAS) that is the input signal INN minus a bias voltage. Namely, the unbalanced setting of the current supply capacities set by the control circuit 10 enables the provision of offset adjustment.

The offset adjustment of the comparator illustrated in FIG. 1 does not cause a drop in the operating speed because no parasitic capacitance is needlessly attached to speed-sensitive nodes. The employed configuration enables the provision of offset adjustment by use of a configuration simpler than that of the offset control that is based on analog signal control such as subtracting a bias voltage from an input signal.

Figure 5:
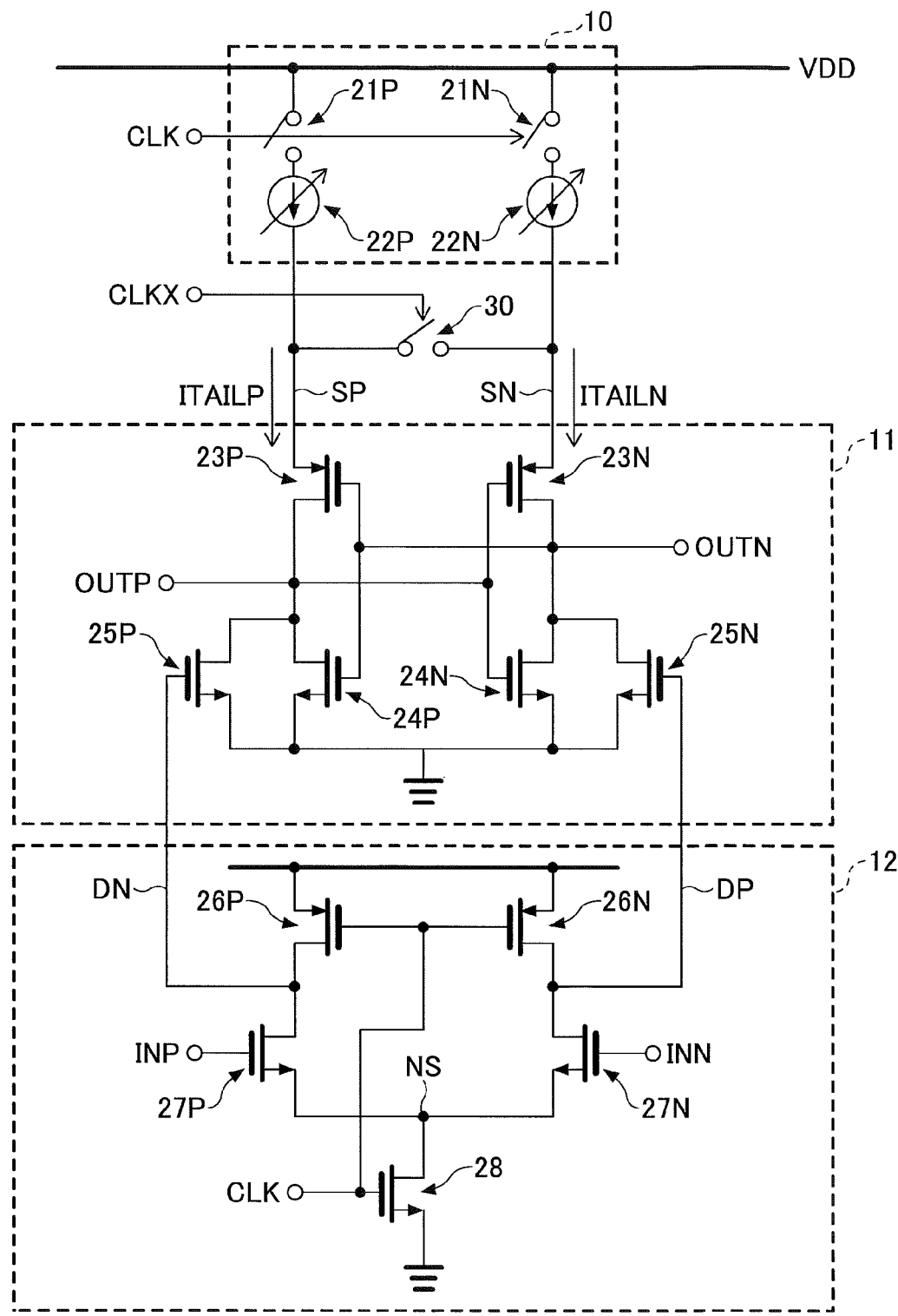
FIG. 5 is a drawing illustrating a variation of the configuration of the comparator according to the embodiment.

FIG. 5 is a drawing illustrating a variation of the configuration of the comparator according to the embodiment. In FIG. 5, the same or corresponding elements as those of FIG. 1 are referred to by the same or corresponding numerals, and a description thereof will be omitted as appropriate.

The comparator illustrated in FIG. 5 includes a switch circuit 30 in addition to the configuration of the comparator illustrated in FIG. 1. The switch circuit 30 connects two nodes SP and SN to each other in the first operating state (i.e., CLK=LOW), and disconnects the two nodes SP and SN from each other in the second operating state (i.e., CLK=HIGH). The two nodes SP and SN are situated at the points at which the two inverters receive the respective drive voltages.

The provision of the switch circuit 30 makes it possible for the voltages of the nodes SP and SN receiving the drive currents for the two inverters to be set equal to each other at the beginning of the second operating state. As a result, when the latch circuit is activated in the second operating state, a difference between the voltage signals DN and DP and a difference between the current supply capacities of the control circuit 10 are the only factors that mainly affect the generation of a voltage difference between the output nodes OUTP and OUTN. This arrangement ensures that the offset adjustment function of the comparator is accurately set.

Even in the absence of the switch circuit 30, the threshold levels of the PMOS transistors 23P and 23N that are identical to each other ensure that the nodes SP and SN are set to an equal potential when the output nodes OUTP and OUTN are set to the ground voltage in the first operating state. Due to manufacturing variation or the like, however, the threshold levels of the PMOS transistors 23P and 23N may not be precisely identical to each other. In consideration of such a case, it is preferable to employ the switch circuit 30.

Figure 6:
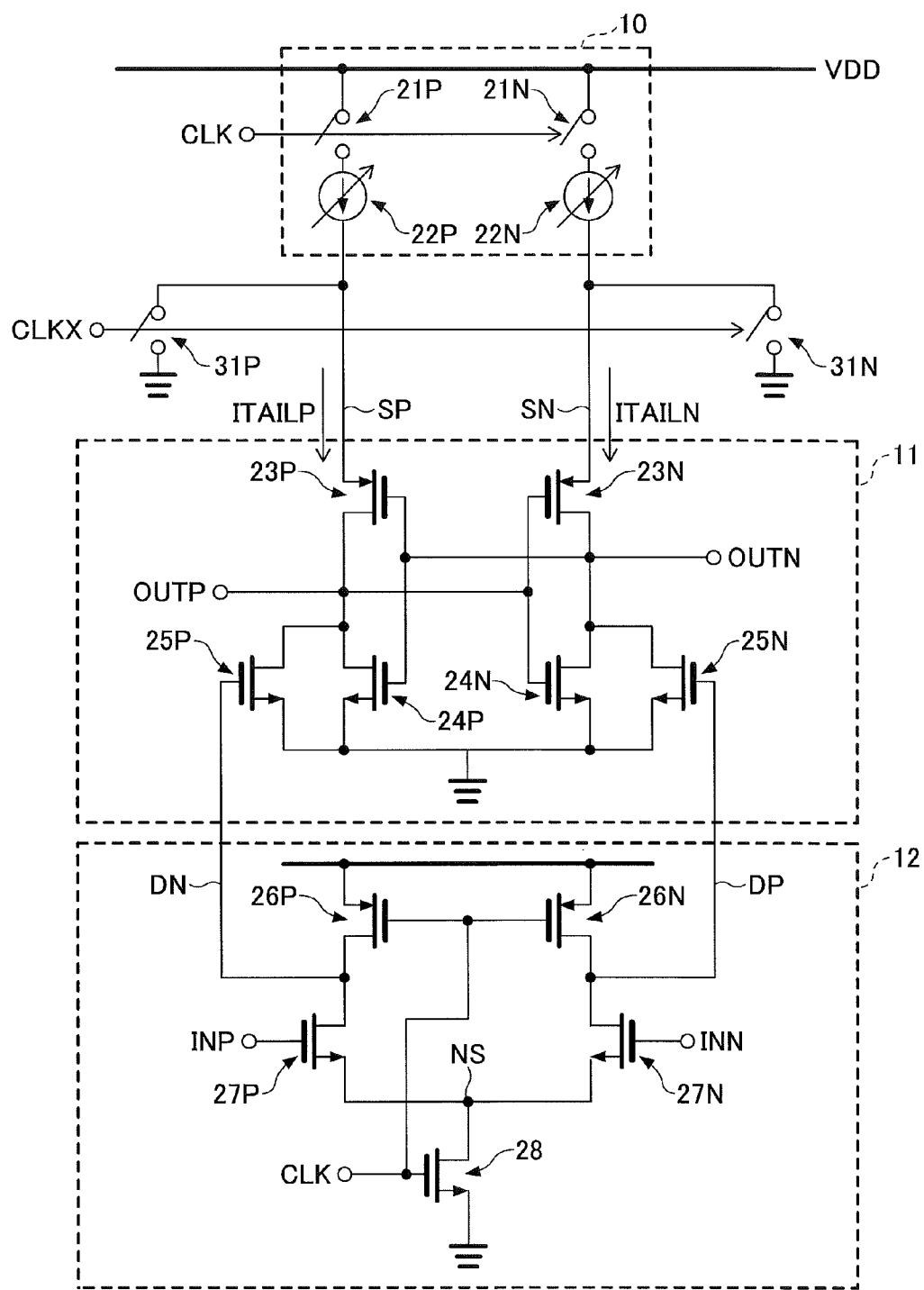
FIG. 6 is a drawing illustrating a variation of the configuration of the comparator according to the embodiment.

FIG. 6 is a drawing illustrating a variation of the configuration of the comparator according to the embodiment. In FIG. 6, the same or corresponding elements as those of FIG. 1 are referred to by the same or corresponding numerals, and a description thereof will be omitted as appropriate.

The comparator illustrated in FIG. 6 includes switch circuits 31P and 31N in addition to the configuration of the comparator illustrated in FIG. 1. The switch circuits 31P and 31N connects the two nodes SP and SN to a predetermined potential (i.e., ground potential) in the first operating state (i.e., CLK=LOW), and disconnects the two nodes SP and SN from the predetermined potential (i.e., ground potential) in the second operating state (i.e., CLK=HIGH). The two nodes SP and SN are situated at the points at which the two inverters receive the respective drive voltages.

The provision of the switch circuits 31P and 31N makes it possible for the voltages of the nodes SP and SN receiving the drive currents for the two inverters to be set equal to the same potential (i.e. ground potential) at the beginning of the second operating state. As a result, when the latch circuit is activated in the second operating state, a difference between the voltage signals DN and DP and a difference between the current supply capacities of the control circuit 10 are the only factors that mainly affect the generation of a voltage difference between the output nodes OUTP and OUTN. This arrangement ensures that the offset adjustment function of the comparator is accurately set.

Even in the absence of the switch circuits 31P and 31N, the threshold levels of the PMOS transistors 23P and 23N that are identical to each other ensure that the nodes SP and SN are set to an equal potential when the output nodes OUTP and OUTN are set to the ground voltage in the first operating state. Due to manufacturing variation or the like, however, the threshold levels of the PMOS transistors 23P and 23N may not be precisely identical to each other. In consideration of such a case, it is preferable to employ the switch circuits 31P and 31N.

Figure 7:
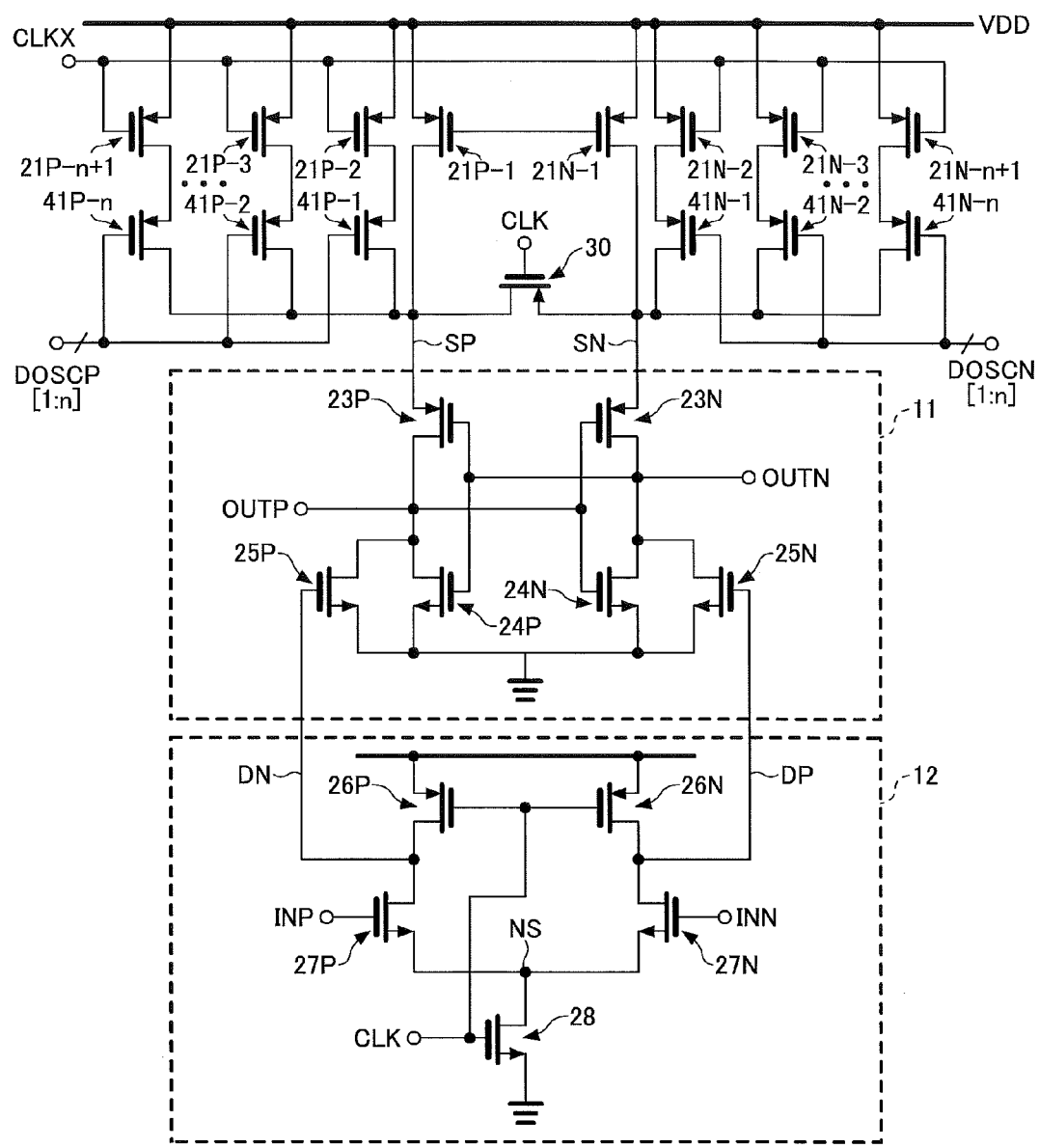
FIG. 7 is a drawing illustrating an example of a detailed configuration of the comparator according to the embodiment.

FIG. 7 is a drawing illustrating an example of a detailed configuration of the comparator according to the embodiment. In FIG. 7, the same or corresponding elements as those of FIG. 1 and FIG. 5 are referred to by the same or corresponding numerals, and a description thereof will be omitted as appropriate.

The comparator illustrated in FIG. 7 includes a plurality (n: positive integer) of PMOS transistors 41P-1 through 41P-n connected in parallel to each other on one path, and includes a plurality (n: positive integer) of PMOS transistors 41N-1 through 41N-n connected in parallel to each other on the other path. The PMOS transistors 41P-1 through 41P-n and 41N-1 through 41N-n correspond to the constant-current circuits 22P and 22N, respectively, of the control circuit 10 illustrated in FIG. 1. The comparator illustrated in FIG. 7 further includes PMOS transistors 21P-1 through 21P-n+1 and 21N-1 through 21N-n+1 that correspond to the switch circuits 21P and 21N, respectively, of the control circuit 10 illustrated in FIG. 1. A PMOS transistor illustrated in FIG. 7 corresponds to the switch circuit 30 illustrated in FIG. 5.

The gates of the PMOS transistors 21P-1 through 21P-n+1 and 21N-1 through 21N-n+1 receive the clock signal CLK. The gates of the PMOS transistors 41P-1 through 41P-n receive an n-bit control signal DOSCP[1:n]. The gates of the PMOS transistors 41N-1 through 41N-n receive an n-bit control signal DOSCN[1:n]. The number of bits that are "1" in the control signal DOSCP[1:n] is controlled to adjust the current supply capacity on the path through which a drive voltage is applied to the inverter situated on the left-hand side in FIG. 7. The number of bits that are "1" in the control signal DOSCN[1:n] is controlled to adjust the current supply capacity on the path through which a drive voltage is applied to the inverter situated on the right-hand side in FIG. 7. In the case of the comparator illustrated in FIG. 7, the current supply capacities of the two paths may be made different from each other throughout the entire period of the second operating state (i.e., CLK=HIGH).

Figure 8:
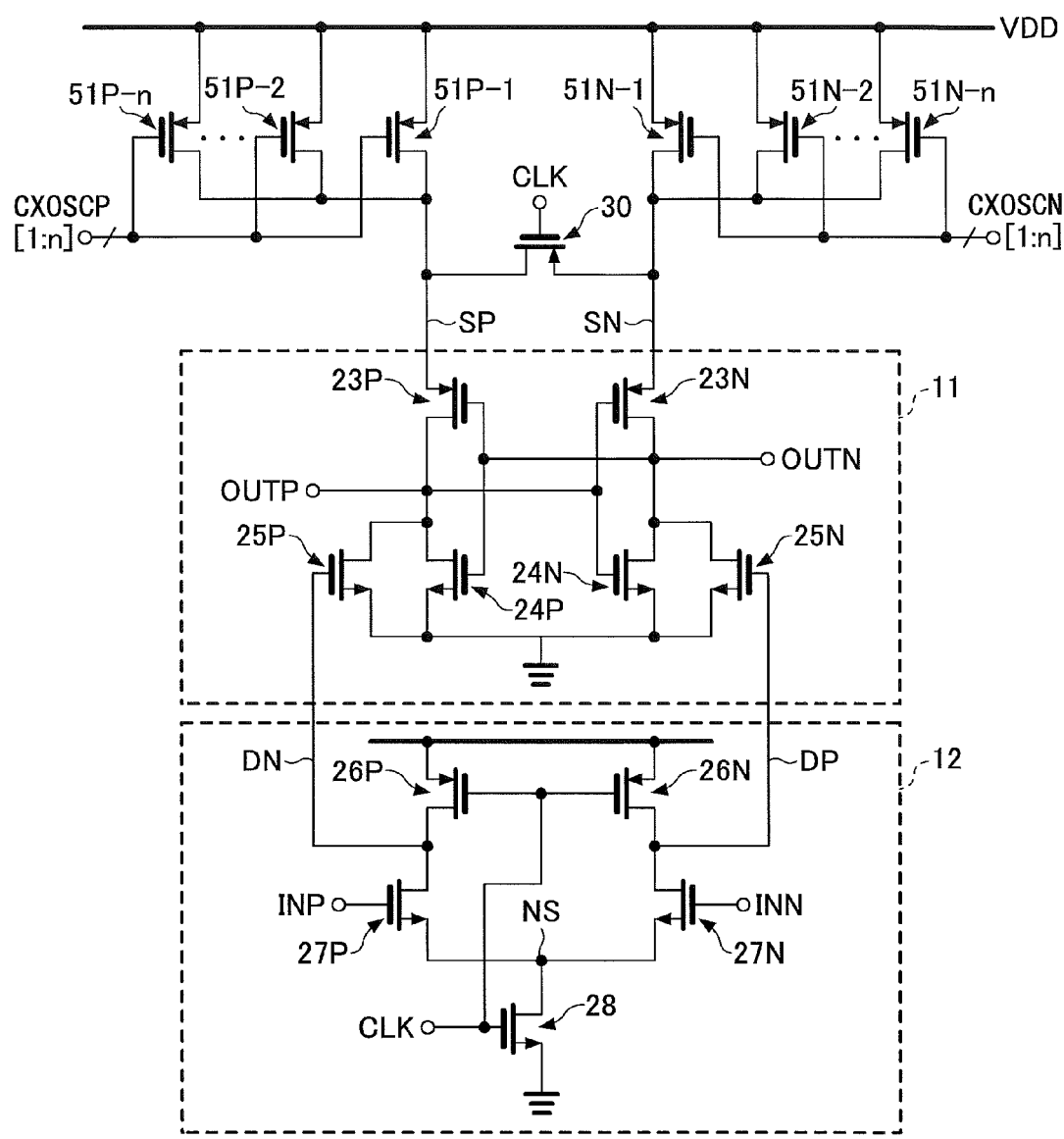
FIG. 8 is a drawing illustrating another example of a detailed configuration of the comparator according to the embodiment.

FIG. 8 is a drawing illustrating another example of a detailed configuration of the comparator according to the embodiment. In FIG. 8, the same or corresponding elements as those of FIG. 1 and FIG. 5 are referred to by the same or corresponding numerals, and a description thereof will be omitted as appropriate.

The comparator illustrated in FIG. 8 includes a plurality (n) of PMOS transistors 51P-1 through 51P-n connected in parallel to each other on one path, and includes a plurality (n) of PMOS transistors 51N-1 through 51N-n connected in parallel to each other on the other path. The PMOS transistors 51P-1 through 51P-n and 51N-1 through 51N-n correspond to the switch circuits 21P and 21N and the constant-current circuits 22P and 22N, respectively, of the control circuit 10 illustrated in FIG. 1. The PMOS transistor 30 illustrated in FIG. 8 corresponds to the switch circuit 30 illustrated in FIG. 5. The gates of the PMOS transistors 51P-1 through 51P-n receive an n-bit control signal CXOSCP[1:n]. The gates of the PMOS transistors 51N-1 through 51N-n receive an n-bit control signal CXOSCN[1:n].

Figure 9:
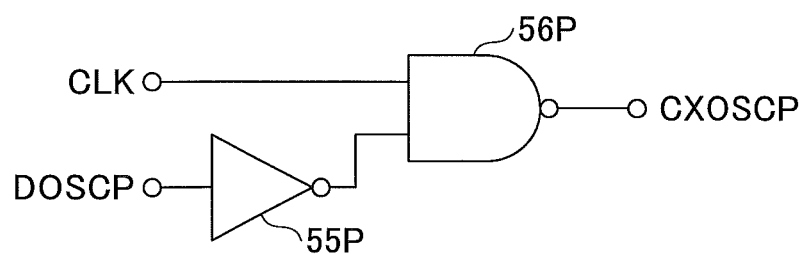
FIG. 9 is a drawing illustrating an example of the configuration of a first circuit that generates an n-bit control signal for PMOS transistors.

FIG. 9 is a drawing illustrating an example of the configuration of a first circuit that generates an n-bit control signal for PMOS transistors. The circuit illustrated in FIG. 9 includes an inverter 55P and a NAND gate 56P. This circuit outputs a DOSCP signal when the clock signal CLK is HIGH, and outputs LOW when the clock signal CLK is LOW. Provision of n circuits having the configuration illustrated in FIG. 9 makes it possible for the n-bit control signal CXOSCP[1:n] to be generated separately from each other.

Figure 10:
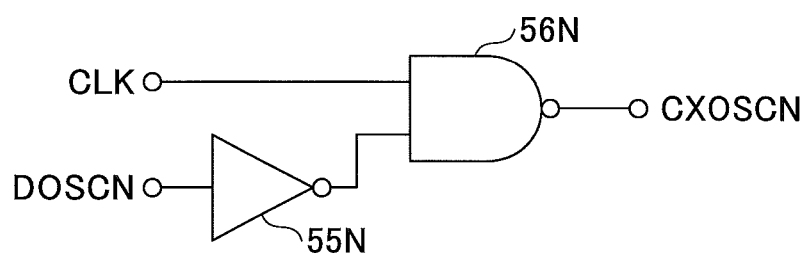
FIG. 10 is a drawing illustrating an example of the configuration of a second circuit that generates an n-bit control signal for PMOS transistors.

FIG. 10 is a drawing illustrating an example of the configuration of a second circuit that generates an n-bit control signal for PMOS transistors. The circuit illustrated in FIG. 10 includes an inverter 55N and a NAND gate 56N. This circuit outputs a DOSCN signal when the clock signal CLK is HIGH, and outputs LOW when the clock signal CLK is LOW. Provision of n circuits having the configuration illustrated in FIG. 10 makes it possible for the n-bit control signal CXOSCN[1:n] to be generated separately from each other.

The circuits illustrated in FIG. 9 and FIG. 10 are used to generate signals each of which is a logical product between the clock signal CLK and a control signal, and these signals are applied to the control nodes of the PMOS transistors 51P-1 through 51P-n and 51N-1 through 51N-n. With this arrangement, the PMOS transistors 51P-1 through 51P-n and 51N-1 through 51N-n provide the switching function of the switch circuits 21P and 21N of the control circuit 10 as well as the current supply capacity adjusting function of the constant-current circuits 22P and 22N of the control circuit 10, respectively.

Figure 11:
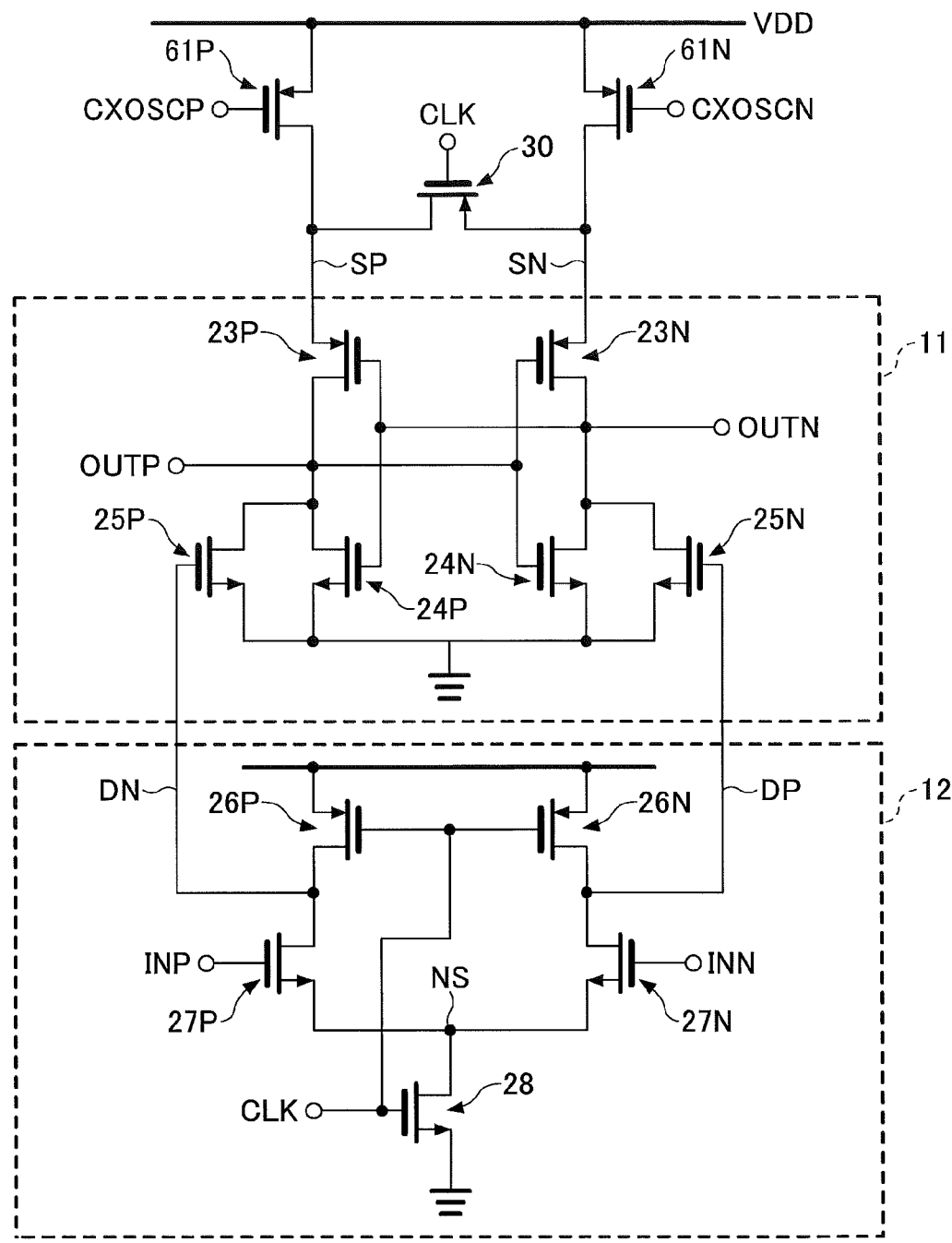
FIG. 11 is a drawing illustrating another example of a detailed configuration of the comparator according to the embodiment.

FIG. 11 is a drawing illustrating another example of a detailed configuration of the comparator according to the embodiment. In FIG. 11, the same or corresponding elements as those of FIG. 1 and FIG. 7 are referred to by the same or corresponding numerals, and a description thereof will be omitted as appropriate.

The comparator illustrated in FIG. 11 includes two switch circuits (i.e., PMOS transistors 61P and 61N) that are provided in the two paths, respectively. In this comparator, the point in time at which the PMOS transistors 61P and 61N are changed from the nonconductive state to the conductive state is made different between the PMOS transistors 61P and 61N, thereby causing electric currents to start flowing in the two paths at different timings. With this arrangement, the current supply capacities on the two paths through which respective drive voltages are separately applied to the two inverters are controlled by the control circuit 10, which makes the current supply capacities on these two paths different from each other during at least part of the period of the second operating state (i.e., CLK=HIGH). Namely, the current supply capacities of the two paths are different from each other during the period in which one of the PMOS transistors 61P and 61N is conductive and the other one thereof is nonconductive in the second operating state (i.e., CLK=HIGH). The gates of the PMOS transistors 61P and 61N receive control signals CXOSCP and CXOSCN, respectively.

Figure 12:
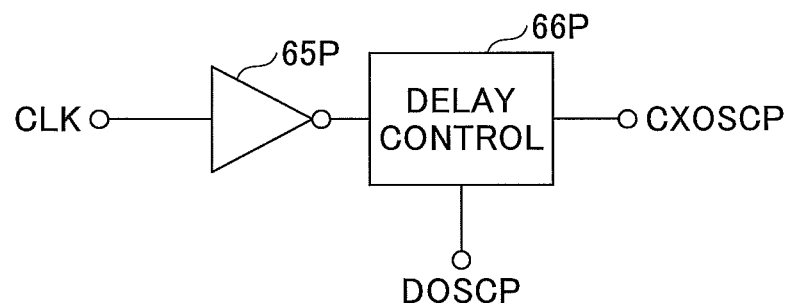
FIG. 12 is a drawing illustrating an example of the configuration of a first circuit that generates a control signal for PMOS transistors.

FIG. 12 is a drawing illustrating an example of the configuration of a first circuit that generates a control signal for PMOS transistors. The circuit illustrated in FIG. 12 includes an inverter 65P and a delay control circuit 66P. This circuit uses the inverter 65P to invert the clock signal CLK, and uses the delay control circuit 66P to delay the inverted clock signal CLK. The output signal CXOSCP of the delay control circuit 66P is applied to the gate of the PMOS transistor 61P illustrated in FIG. 11. The delay length of the delay control circuit 66P is set in response to the amount of offset and the direction in which the offset adjustment is made (i.e., a choice as to which one of OUTP and OUTN is more likely to become HIGH). It may be noted that the current supply capacities of the PMOS transistors 61P and 61N in the conductive state are identical to each other.

Figure 13:
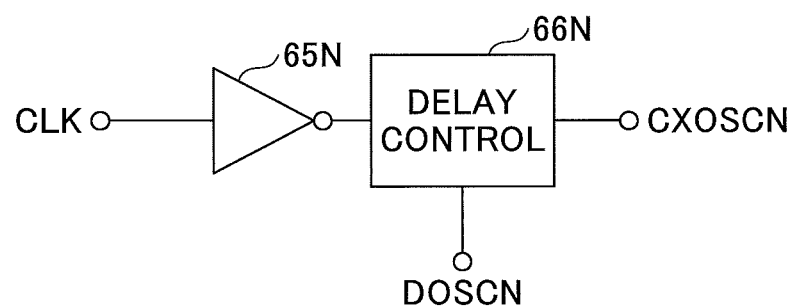
FIG. 13 is a drawing illustrating an example of the configuration of a second circuit that generates a control signal for PMOS transistors.

FIG. 13 is a drawing illustrating an example of the configuration of a second circuit that generates a control signal for PMOS transistors. The circuit illustrated in FIG. 13 includes an inverter 65N and a delay control circuit 66N. This circuit uses the inverter 65N to invert the clock signal CLK, and uses the delay control circuit 66N to delay the inverted clock signal CLK. The output signal CXOSCN of the delay control circuit 66N is applied to the gate of the PMOS transistor 61N illustrated in FIG. 11. The delay length of the delay control circuit 66N is set in response to the amount of offset and the direction in which the offset adjustment is made (i.e., a choice as to which one of OUTP and OUTN is more likely to become HIGH).

The circuits illustrated in FIG. 12 and FIG. 13 are used to supply the inverted and delayed clock signal CLK to the control nodes of the PMOS transistors 61P and 61N. With this arrangement, the PMOS transistors 61P and 61N provide the switching function of the switch circuits 21P and 21N of the control circuit 10 as well as the current supply capacity adjusting function of the constant-current circuits 22P and 22N of the control circuit 10, respectively. The current supply capacity adjusting function is provided by the arrangement in which one of the PMOS transistors 61P and 61N becomes conductive before the other, so that one output node (i.e., OUTP or OUTN) corresponding to the first PMOS transistor to become conductive is set to a higher potential than the other output node.

As was previously described, one of the output nodes (i.e., OUTP or OUTN) is set to a higher potential than the other during at least an early part of the period of the second operating state (i.e., CLK=HIGH), and, then, both of the PMOS transistors 61P and 61N become conductive. The PMOS transistors 61P and 61N both of which are conductive supply electric currents with the same current supply capacity. Despite this, the output node corresponding to the one of the PMOS transistors 61P and 61N that is the first to become conductive receives a bias that makes the HIGH latched state more likely. This bias enables the provision of an offset adjusting mechanism.

Figure 14:
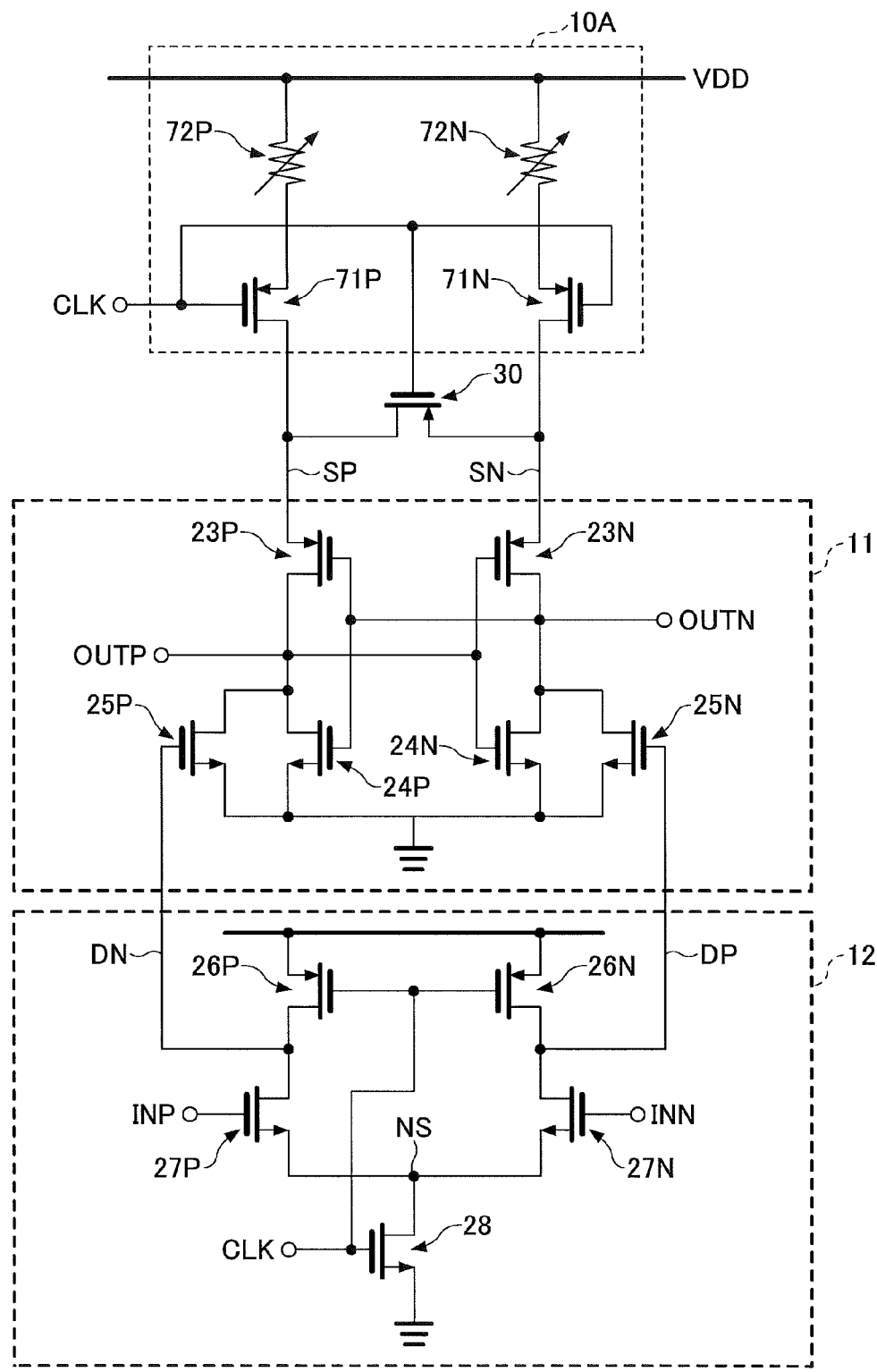
FIG. 14 is a drawing illustrating another example of a detailed configuration of the comparator according to the embodiment.

FIG. 14 is a drawing illustrating another example of a detailed configuration of the comparator according to the embodiment. In FIG. 14, the same or corresponding elements as those of FIG. 1 and FIG. 7 are referred to by the same or corresponding numerals, and a description thereof will be omitted as appropriate.

A control circuit 10A of the comparator illustrated in FIG. 14 includes PMOS transistors 71P and 71N and variable resistance elements (circuits) 72P and 72N. The control circuit 10A makes the resistance values of the two variable resistance elements different from each other, thereby making the current supply capacities in the two paths different from each other. The PMOS transistors 71P and 71N correspond to the switch circuits 21P and 21N, respectively, of the control circuit 10 illustrated in FIG. 1.

With the variable resistance elements 72P and 72N being set to certain resistance values, the amounts of electric currents that flow in the two paths are responsive to these resistance values, the resistance values of other resistance components existing in the two current paths, and a difference between the power supply voltage VDD and the ground voltage. In this sense, the variable resistance elements 72P and 72N that are capable of adjusting the resistance values thereof (i.e., the values indicative of how easy it is for electric current to flow) can adjust the current supply capacities in the two paths.

Figure 15:
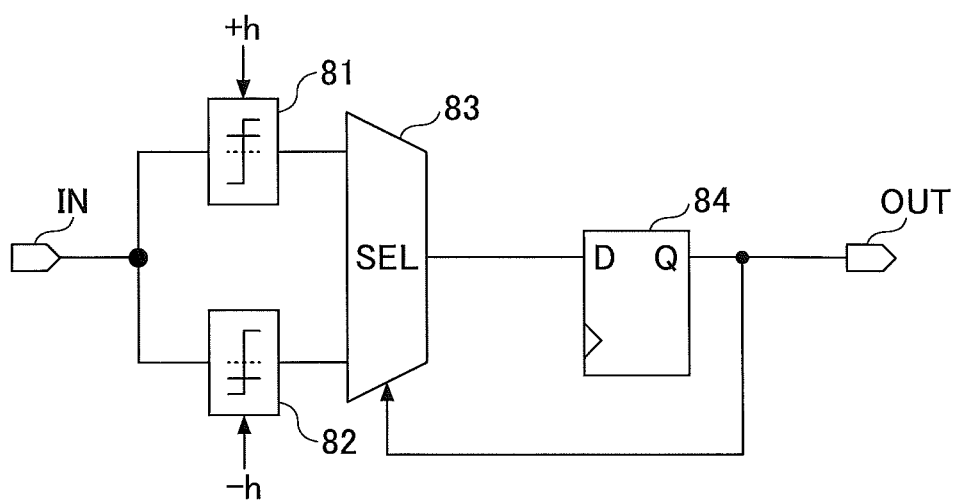
FIG. 15 is a drawing illustrating an example of the configuration of an electronic circuit including the comparator.

FIG. 15 is a drawing illustrating an example of the configuration of an electronic circuit including the comparator. The electronic circuit illustrated in FIG. 15 includes comparators 81 and 82, a selector circuit 83, and a flip-flop 84. The input signal applied to an input terminal IN is supplied to the comparators 81 and 82, which perform comparison operations. The comparators 81 and 82 have the offset amounts thereof set to different amounts (+h, −h), and may thus produce different comparison results depending on the level of the input signal. The comparison results of the comparators 81 and 82 are supplied to the selector circuit 83. The selector circuit 83 selects one of the comparison results, which is then supplied to the flip-flop 84. The flip-flop 84 stores the comparison result therein as either data "0" or data "1". The store data of the flip-flop 84 is supplied as a selection control signal to the selector circuit 83.

In this configuration, the comparison result output from the selector circuit 83 in a given clock cycle is dependent on the data value that is decided and stored in the flip-flop 84 in the immediately preceding cycle. In this manner, one of the two decided data values that are currently obtained by use of different offset values is selected based on the data value decided in the immediately preceding cycle, which enables the realization of a decision-feedback equalizer.

Any one of the comparators illustrated in FIG. 1, FIG. 5, FIG. 6, FIG. 7, FIG. 8, FIG. 11, and FIG. 14 may be used as the comparators 81 and 82 of the electronic circuit illustrated in FIG. 15. This arrangement enables the realization of a high-speed decision-feedback equalizer.

The electronic circuit employing the comparators of the present disclosures may be a receiver circuit or an AD converter circuit. Comparators are employed in various types of electronic circuits. An electronic circuit that uses one or more comparators having the offset adjusting function of the present disclosures is not limited to a receiver circuit and an AD converter circuit.

According to at least one embodiment, a double-tail comparator is provided that allows an offset to be adjusted without dropping operating speed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A comparator, comprising:
an input-stage circuit configured to set, in a first operating state, two voltage signals in a first voltage state, and to change, in a second operating state, the two voltage signals from the first voltage state to a second voltage state at respective different speeds whose difference is responsive to a difference between voltage levels of two input signals;
a latch-stage circuit that includes two field effect transistors and two inverters, the two field effect transistors receiving the two voltage signals at respective control nodes thereof and disposed between two respective output nodes and a node of a predetermined potential, the two inverters being cross-coupled between the two output nodes, and the two inverters being placed in an inactive state in the first operating state and placed in an active state in the second operating state;
a control circuit configured to control current supply capacities in two paths through which drive voltages are applied to the two inverters separately from each other; and
a switch circuit configured to connect two nodes to each other in the first operating state and to disconnect the two nodes from each other in the second operating state, the two nodes being nodes at which the two inverters receive the drive voltages, respectively, the switch circuit being situated in a connecting path between the two nodes and not situated in either of the two paths for supplying the drive voltages, the connecting path being not for supplying any one of the drive voltages,
wherein the control circuit is configured to cause the current supply capacities in the two paths to be different from each other during at least part of a period of the second operating state.

2. The comparator as claimed in claim 1, wherein the control circuit includes a plurality of field effect transistors connected in parallel to each other in each of the two paths.

3. The comparator as claimed in claim 2, wherein the control circuit is configured to apply, to control nodes of the field effect transistors, signals each of which is a logical product between a control signal and a clock signal that defines a period of the first operating state and the period of the second operating state.

4. The comparator as claimed in claim 1, wherein the control circuit includes two switch circuits disposed in the two paths, respectively, and configured to change the two switch circuits from a nonconductive state to a conductive state at different timings, so that points in time at which electric currents start flowing in the two paths are made different from each other.

5. The comparator as claimed in claim 1, wherein the control circuit includes two variable resistance elements disposed in the two paths, respectively, and configured to make resistance values of the two variable resistance elements different from each other, so that the current supply capacities in the two paths are made different from each other.

6. An electronic circuit, comprising:
a comparator; and
a circuit configured to receive an output of the comparator,
wherein the comparator includes:
an input-stage circuit configured to set, in a first operating state, two voltage signals in a first voltage state, and to change, in a second operating state, the two voltage signals from the first voltage state to a second voltage state at respective different speeds whose difference is responsive to a difference between voltage levels of two input signals;
a latch-stage circuit that includes two field effect transistors and two inverters, the two field effect transistors receiving the two voltage signals at respective control nodes thereof and disposed between two respective output nodes and a node of a predetermined potential, the two inverters being cross-coupled between the two output nodes, and the two inverters being placed in an inactive state in the first operating state and placed in an active state in the second operating state;
a control circuit configured to control current supply capacities in two paths through which drive voltages are applied to the two inverters separately from each other; and
a switch circuit configured to connect two nodes to each other in the first operating state and to disconnect the two nodes from each other in the second operating state, the two nodes being nodes at which the two inverters receive the drive voltages, respectively, the switch circuit being situated in a connecting path between the two nodes and not situated in either of the two paths for supplying the drive voltages, the connecting path being not for supplying any one of the drive voltages,
wherein the control circuit is configured to cause the current supply capacities in the two paths to be different from each other during at least part of a period of the second operating state.

7. A method of controlling a double-tail comparator which includes an input stage and an output latch stage, the method comprising:
making current supply capacities in two paths different from each other, the two paths being paths through which drive voltages are applied to two inverters separately from each other, the two inverters being cross-coupled between two output nodes of the output latch stage;
connecting two nodes to each other through a connecting path during an inactive state of the output latch stage, and disconnecting the connecting path between the two nodes during an active state of the output latch stage, the two nodes being nodes at which the two inverters receive the drive voltages, respectively, the connecting path being not for supplying any one of the drive voltages.

* * * * *